United States Patent
Subbarao (10) Patent No.: US 12,045,168 B2
(45) Date of Patent: Jul. 23, 2024

(54) TIMED DATA TRANSFER BETWEEN A HOST SYSTEM AND A MEMORY SUB-SYSTEM

(71) Applicant: Micron Technology, Inc., Boise, ID (US)

(72) Inventor: Sanjay Subbarao, Irvine, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/942,725

(22) Filed: Sep. 12, 2022

(65) Prior Publication Data

US 2023/0004495 A1    Jan. 5, 2023

Related U.S. Application Data (63) Continuation of application No. 17/399,405, filed on Aug. 11, 2021, now Pat. No. 11,487,666, which is a
(Continued)

(51) Int. Cl.
*G06F 12/0844* (2016.01)
*G11C 11/417* (2006.01)

(52) U.S. Cl.
CPC .. *G06F 12/0844* (2013.01); *G06F 2212/1024* (2013.01); *G11C 11/417* (2013.01)

(58) Field of Classification Search
CPC ......... G06F 12/0844; G06F 2212/1024; G06F 3/0611; G06F 3/0656; G06F 3/0659;
(Continued)

(56) References Cited

U.S. PATENT DOCUMENTS 7,577,787 B1 * 8/2009 Yochai ................ G06F 12/0804
711/113
9,170,939 B1 10/2015 Jones et al.
(Continued)

FOREIGN PATENT DOCUMENTS

KR    20140098792 A    8/2014

OTHER PUBLICATIONS

Title: Timed Data Transfer between a Host System and a Memory Sub-System U.S. Appl. No. 16/865,244, filed May 1, 2020 Inventor: Sanjay Subbarao Status: Patented Case, Status Date: Feb. 10, 2021.
(Continued)

*Primary Examiner* — Sean D Rossiter
(74) *Attorney, Agent, or Firm* — Greenberg Traurig (57) ABSTRACT

A memory sub-system configured to schedule the transfer of data from a host system for write commands to reduce the amount and time of data being buffered in the memory sub-system. For example, after receiving a plurality of streams of write commands from a host system, the memory sub-system identifies a plurality of media units in the memory sub-system for concurrent execution of a plurality of write commands respectively. In response to the plurality of commands being identified for concurrent execution in the plurality of media units respectively, the memory sub-system initiates communication of the data of the write commands from the host system to a local buffer memory of the memory sub-system. The memory sub-system has capacity to buffer write commands in a queue, for possible out of order execution, but limited capacity for buffering only the data of a portion of the write commands that are about to be executed.

18 Claims, 6 Drawing Sheets

Related U.S. Application Data continuation of application No. 16/865,244, filed on May 1, 2020, now Pat. No. 11,113,198.

(60) Provisional application No. 62/844,059, filed on May 6, 2019.

(58) Field of Classification Search
CPC .............. G06F 3/0679; G06F 12/0868; G06F 12/0246; G06F 2212/1044; G06F 2212/214; G06F 2212/507; G06F 2212/7201; G06F 2212/7203; G06F 2212/7204; G06F 2212/7208; G11C 11/417; G11C 11/413
See application file for complete search history.

(56) References Cited

U.S. PATENT DOCUMENTS

| | | |
|---|---|---|
| 9,354,887 B2 | 5/2016 | Mejdrich et al. |
| 11,113,198 B2 | 9/2021 | Subbarao |
| 11,487,666 B2 | 11/2022 | Subbarao |
| 2007/0234310 A1 | 10/2007 | Zhang et al. |
| 2012/0221767 A1 | 8/2012 | Post et al. |
| 2013/0262745 A1 | 10/2013 | Lin et al. |
| 2014/0354660 A1 | 12/2014 | Balci et al. |
| 2015/0071003 A1 | 3/2015 | Numata et al. |
| 2016/0048343 A1* | 2/2016 | Pekny .................... G11C 16/32 711/103 |
| 2016/0364239 A1 | 12/2016 | Lechenko et al. |
| 2017/0039140 A1* | 2/2017 | Zhu ......................... H04L 67/02 |
| 2018/0335947 A1 | 11/2018 | Martineau et al. |
| 2019/0004949 A1 | 1/2019 | Kim et al. |
| 2019/0102308 A1* | 4/2019 | Jia ....................... G06F 11/3419 |
| 2020/0272532 A1* | 8/2020 | Takahashi ........... G06F 11/0742 |
| 2020/0356484 A1 | 11/2020 | Subbarao |
| 2020/0409855 A1* | 12/2020 | Subbarao ............ G06F 12/0811 |
| 2021/0373804 A1* | 12/2021 | Gorobets ................ G06F 3/068 |
| 2021/0374060 A1 | 12/2021 | Subbarao |
| 2022/0083369 A1* | 3/2022 | Snyder ................... G06F 9/467 |

OTHER PUBLICATIONS

Title: Timed Data Transfer between a Host System and a Memory Sub-System U.S. Appl. No. 17/399,405, filed Aug. 11, 2021 Inventor: Sanjay Subbarao Status: Notice of Allowance Mailed—Application Received in Office of Publications, Status Date: Jun. 15, 2022.

International Search Report and Written Opinion, PCT/US2020/031476, mailed Aug. 11, 2020.

* cited by examiner

TIMED DATA TRANSFER BETWEEN A HOST SYSTEM AND A MEMORY SUB-SYSTEM

RELATED APPLICATIONS

The present application is a continuation application of U.S. patent application Ser. No. 17/399,405 filed Aug. 11, 2021, which is a continuation application of U.S. patent application Ser. No. 16/865,244 filed May 1, 2020 and issued as U.S. Pat. No. 11,113,198 on Sep. 7, 2021, which claims priority to Prov. U.S. Pat. App. Ser. No. 62/844,059 filed May 6, 2019, the entire disclosures of which applications are hereby incorporated herein by reference.

TECHNICAL FIELD

At least some embodiments disclosed herein relate to memory systems in general, and more particularly, but not limited to timed data transfer between a host system and a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

At least some aspects of the present disclosure are directed to data transfer between a host system and a memory sub-system, where the data transfer is timed/scheduled to reduce the buffer memory requirement in the memory sub-system and thus reduce the requirement for a power-fail hold-up circuit in the memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Traditionally, caching based architectures are used in a memory sub-system to isolate the host system from the memory sub-system. When a write command is received in the memory sub-system from the host system, data is transferred from the host system to the cache in the memory sub-system. When the write workload exceeds the bandwidth of the media of the memory sub-system to commit, store, or program the data into the media, throttling of the input/output activities in the host system occurs due to the lack of available space in the cache buffer. While such architectures can provide a low latency write using cached data, it has disadvantages when the write workload exceeds the bandwidth of the media of the memory sub-system. For example, the number of outstanding commands that can be issued to the memory sub-system is limited by the size of the cache buffer memory in the memory sub-system. An increased size of the cache buffer memory increases the requirement for the energy storage capability of the power-fail back-up circuitry. Further, when two or more commands are mapped to the same media unit that can execute only one command at a time, a command collision occurs. The collision can lead to both higher buffer memory consumption and higher lifetime of data being stored in the buffer memory. This can result in increased system costs, in terms of increased size requirements for the cache buffer memory and increased energy storage capability of the power-fail hold-up circuitry. Further, a first write stream may block a second write stream by buffering data in the cache buffer memory and leaving no buffer space for the second write stream such that even when there are media units available to execute write commands for the second write stream, the second write stream is blocked for the lack of buffer space in the cache buffer memory.

At least some aspects of the present disclosure address the above and other deficiencies through timed data transfer between the host system and the memory sub-system. A queuing mechanism is configured to allow commands to be accepted in a memory sub-system without the data to be recorded in the memory sub-system. A queued command can be mapped to a media unit and held in a pending queue per media unit. When the media unit becomes available for executing a write command, the buffer space is allocated for the data of the write command; and the transfer of data for the write command from the host system to the cache buffer memory of the memory sub-system for recording into the media unit is postponed according to the availability of the media unit to accept data. The commands in the queue for the media unit can be executed out of the order in which the commands are received from the host system. The data is transferred via the cache buffer memory just in time for committing, writing, or programming into the media unit. Thus, non-blocking command processing can be performed. Such an arrangement reduces the size requirement of cache buffer memory, and the lifetime of data in the cache buffer memory. For example, the size of cache buffer memory can be reduced to a size that is proportional to the number of media units that are available to support execution of write commands in parallel. The buffer lifetime can be reduced to a time period proportional to the number of data transfers between the host system and the memory sub-system for concurrent execution of the write commands. The significant reduction in cache buffer memory requirements and buffer lifetime reduces the power-fail hold-up requirement. For example, the static random-access memory (SRAM) memory of the controller of the memory sub-system can be used as the cache buffer memory. Dynamic random access memory (DRAM) caching can be eliminated. Such a technique can eliminate the double cost of power-fail-proof of the volatile memory in the computer system, by keeping the more data in the memory that is controlled by the host and that is power-fail-proof using the circuity in the host system. When such a technique is used, an increased number of host write streams and/or collisions do not increase the requirements for the cache buffer memory and power-fail hold-up circuit in the memory sub-system. Further, such a technique can have the benefit of non-blocking and out of order command processing.

Figure 1:
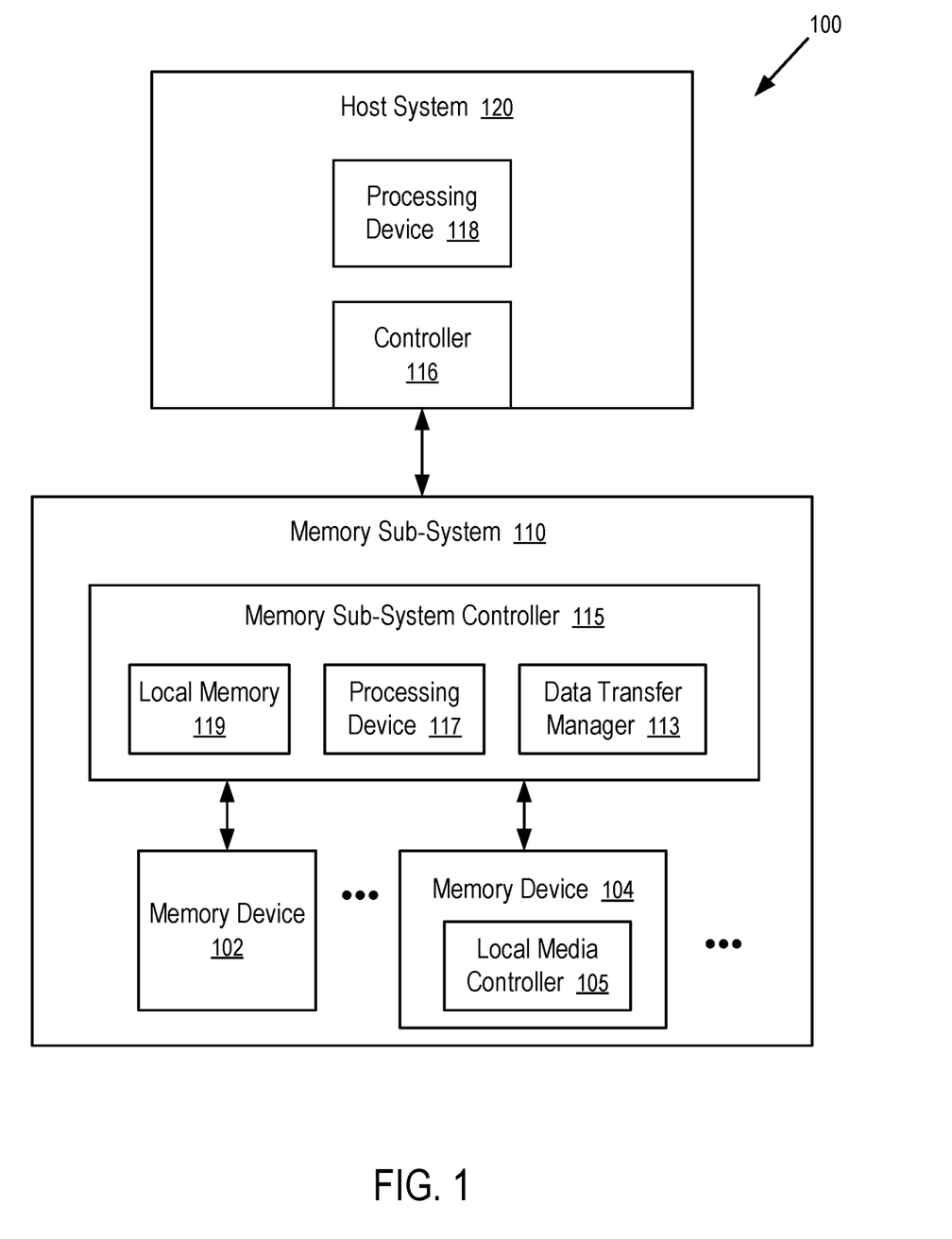
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 102), one or more non-volatile memory devices (e.g., memory device 104), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded multi-media controller (eMMC) drive, a universal flash storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), internet of things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, fibre channel, serial attached SCSI (SAS), a double data rate (DDR) memory bus, small computer system interface (SCSI), a dual in-line memory module (DIMM) interface (e.g., DIMM socket interface that supports double data rate (DDR)), open NAND flash interface (ONFI), double data rate (DDR), low power double data rate (LPDDR), or any other interface. The physical host interface can be used to transmit data between the host system 120 and the memory sub-system 110. The host system 120 can further utilize an NVM express (NVMe) interface to access components (e.g., memory devices 104) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 102, 104. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 102, 104 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 102, 104 can include any combination of the different types of non-volatile memory components and/or volatile memory components. The volatile memory devices (e.g., memory device 102) can be, but are not limited to, random access memory (RAM), such as dynamic random access memory (DRAM) and synchronous dynamic random access memory (SDRAM).

Some examples of non-volatile memory components include a negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 104 can include one or more arrays of memory cells. One type of memory cell, for example, single level cells (SLCs) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 104 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 104 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 104 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), spin transfer torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 104 to perform operations such as reading data, writing data, or erasing data at the memory devices 104 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 104. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 104. The controller 115 can further include host interface circuitry to communicate with the host system 120 via the physical host interface. The host interface circuitry can convert the commands received from the host system into command instructions to access the memory devices 104 as well as convert responses associated with the memory devices 104 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 104.

In some embodiments, the memory devices 104 include local media controllers 105 that operate in conjunction with memory sub-system controller 115 to execute operations on one or more memory cells of the memory devices 104. An external controller (e.g., memory sub-system controller 115) can externally manage the memory device 104 (e.g., perform media management operations on the memory device 104). In some embodiments, a memory device 104 is a managed memory device, which is a raw memory device combined with a local controller (e.g., local controller 105) for media management within the same memory device package. An example of a managed memory device is a managed NAND (MNAND) device.

The computing system 100 includes a data transfer manager 113 in the memory sub-system 110 that postpones the data transfer for write commands until one or more media units/memory components are determined to be available for committing, storing, writing, or programming the data into the media units/memory components. In some embodiments, the controller 115 in the memory sub-system 110 includes at least a portion of the data transfer manager 113. In other embodiments, or in combination, the controller 116 and/or the processing device 118 in the host system 120 includes at least a portion of the data transfer manager 113. For example, the controller 115, the controller 116, and/or the processing device 118 can include logic circuitry implementing the data transfer manager 113. For example, the controller 115, or the processing device 118 (processor) of the host system 120, can be configured to execute instructions stored in memory for performing the operations of the data transfer manager 113 described herein. In some embodiments, the data transfer manager 113 is implemented in an integrated circuit chip disposed in the memory sub-system 110. In other embodiments, the data transfer manager 113 is part of an operating system of the host system 120, a device driver, or an application.

The data transfer manager 113 can schedule the data transfer from the host system 120 to the memory sub-system 110 to reduce the amount and time of data buffering in the memory sub-system 110 before the data is committed, stored, written, or programmed into the media units/memory components 102 to 104. For example, when a media unit (e.g., 102 or 104) is determined to be available (e.g., not busy with other operations) for executing a write command, the data transfer manager 113 initiates the transfer, from the host system 120 to the memory sub-system 110, of the data for the write command. When the media unit (e.g., 102 or 104) is determined to be busy with operations for another command, the data transfer manager 113 postpones the transfer, from the host system 120 to the memory sub-system 110 for the media unit (e.g., 102 or 104), of the data of queued write commands. In general, the data transfer manager 113 is configured to initiate the transfer of data from the host system 120 to the memory sub-system 110 for a subset of the media units 102 to 104 which subset is determined to be available for write operations and postpone the transfer of further data for the remaining subset of the media units 102 to 104 that is busy with other operations. Since the data of the write commands is fetched from the host system 120 just in time for the execution of the write commands, the data transfer manager 113 can reduce and/or minimize the amount and time of data that is being buffered in the memory sub-system 110, in accordance with the bandwidth of the media units/memory components 102 to 104 to write, store, commit, or program data for storage. Further details with regards to the operations of the data transfer manager 113 are described below.

Figure 2:
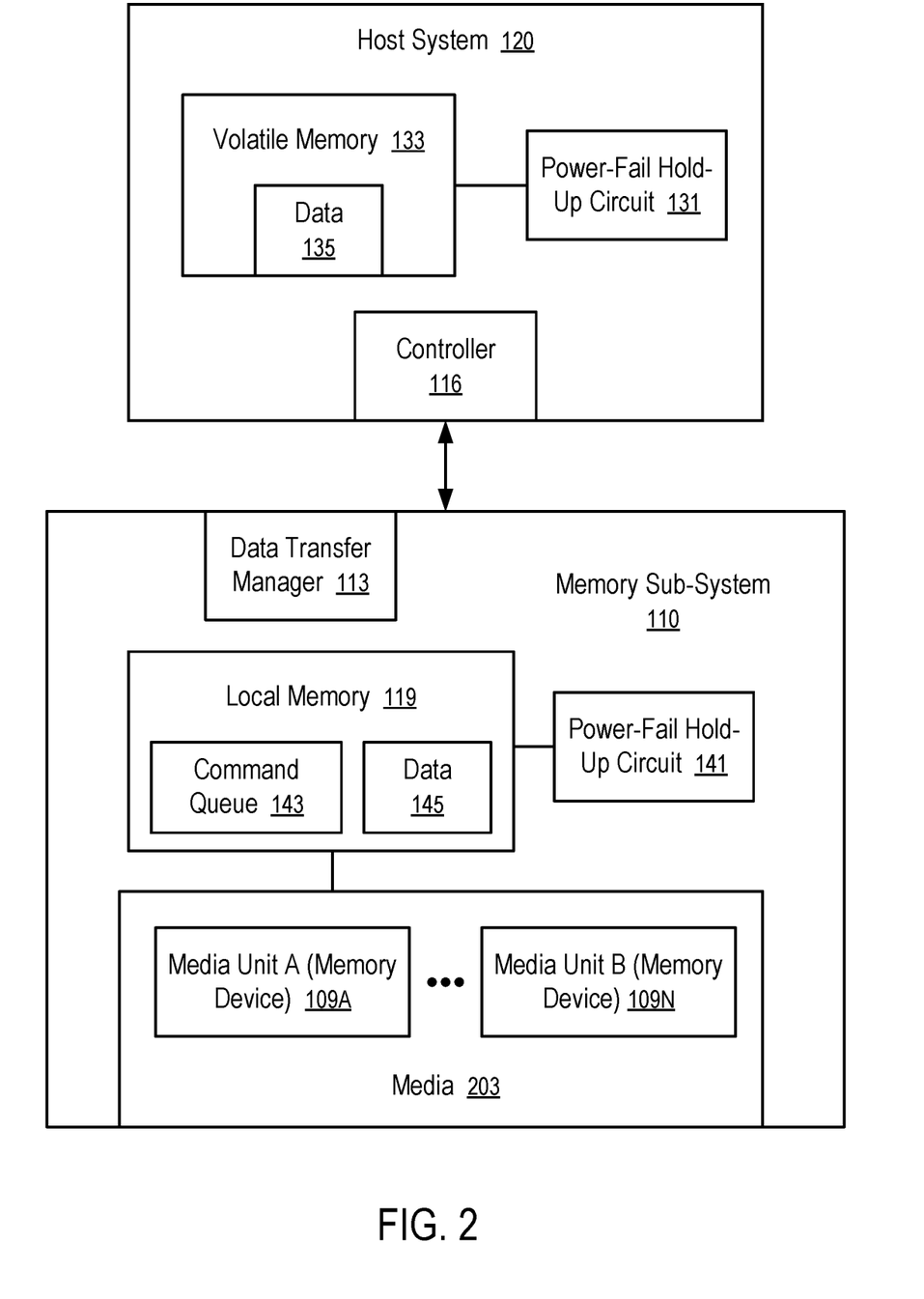
FIG. 2 shows a data transfer manager configured to control timing of data transfer between a host system and a memory sub-system.

FIG. 2 shows a data transfer manager 113 configured to control timing of data transfer between a host system 120 and a memory sub-system 110. For example, the data transfer manager 113 of FIG. 2 can be implemented in the computer system 100 of FIG. 1.

In FIG. 2, the host system 120 has volatile memory 133 that stores data to be written into the media 203 of the memory sub-system 110.

The host system 120 has a power-fail hold-up circuit 131, which can provide sufficient power to the volatile memory 133 and/or other components of the host system 120 (e.g., processing device(s) 118 illustrated in FIG. 1), such that in an event of power failure, data 135 in the volatile memory 133 can be secured. For example, during the power failure event, the power-fail hold-up circuit 131 can power the volatile memory 133 for a period of time that is long enough to allow the data in the volatile memory 133 to be stored into the non-volatile media 203 of the memory sub-system 110, and/or another memory device.

Optionally, the host system 120 can cache the data 135 in non-volatile memory that replaces the volatile memory 133. Thus, the data 135 stored in the non-volatile memory is power-fail-proof; and the power-fail hold-up circuit 131 for the volatile memory 133 can be eliminated. However, the use of non-volatile memory to replace the volatile memory 133 can reduce data access performance and/or increase the cost of the host system 120. In some instances, a combination of volatile memory 133 and non-volatile memory can be used in the host system 120 (e.g., to secure data in a power failure event and/or to improve data access performance).

In FIG. 2, the data transfer manager 113 of the memory sub-system 110 can maintain at least one command queue 143 for commands received from the controller 116 of the host system 120. The commands in the queue 143 can be stored in the local memory 119 of the controller (e.g., 115 illustrated in FIG. 1) of the memory sub-system 110. Write commands from the host system 120 can be accepted into the queue 143 without the data to be written into the media 203. The queuing of the commands allows out of order execution of the commands in the memory sub-system 110 for performance optimization in some situations.

In FIG. 2, the local memory 119 has a power-fail hold-up circuit 141 that can be used to protect the content (e.g., 145 and 143) in the local memory 119 during a power failure event. During the power failure event, the power-fail hold-up circuit 141 can power the local memory 119 for a period of time that is long enough to allow the content to be is stored into non-volatile memory (e.g., media 203).

Optionally, the local memory 119 can be implemented using a non-volatile memory to remove the need for the power-fail hold-up circuit 141, or using a combination of non-volatile memory to reduce the requirement for the power-fail hold-up circuit 141.

In FIG. 2, the data transfer manager 113 is configured to time/schedule the data transfer between the host system 120 and the memory sub-system 110 and thus reduce the size requirement for the local memory 119 and/or the capacity requirement for the power-fail hold-up circuit 141.

For example, the data transfer manager 113 does not automatically accept and/or transfer data of all write commands queued in the command queue 143. To reduce the amount of data 145 being buffered in the local memory 119, the data transfer manager 113 postpones the transfer of data of a write command and initiates the transfer when one of the media units (e.g., 109A or 109N, such as memory devices 102 and/or 104 illustrated in FIG. 1) is determined to be ready for execution of the write command.

Thus, for each of the media units 109A to 109N, the local memory 119 can buffer the data of some write commands but not the data of other write commands. In some implementations, the local memory 119 is configured to buffer data for no more than a predetermined number of commands (e.g., one command per media unit, or two, or another number). However, the command queue 143 can buffer more write commands for each of the media units 109A to 109N (e.g., to enable out of order command execution) than the local memory 119 can buffer the data of write commands for the respective media unit (e.g., 109A or 109N).

The technique of buffering the commands with reduced buffering of the data of the commands can be particularly advantageous when the size ratio/ratios between the commands and their data is/are large.

Optionally, the data transfer manager 113 can configure a queue (e.g., 143) for each of the media units 109A to 109N. Alternatively, the data transfer manager 113 can configure a combined command queue (e.g., 143) for the media units 109A to 109N and dynamically assign write commands to the media units 109A to 109N when the media units 109A to 109N become available for execution of write commands. For example, when a write command is ready to be executed in an available media unit (e.g., 109A or 109N), a portion of the media layout for mapping the logical addresses identified in the write command can be dynamically generated to map the logical addresses to memory locations in the currently available media unit (e.g., 109A or 109N). Thus, the write command can be executed in the available media unit (e.g., 109A or 109N).

Figure 3:
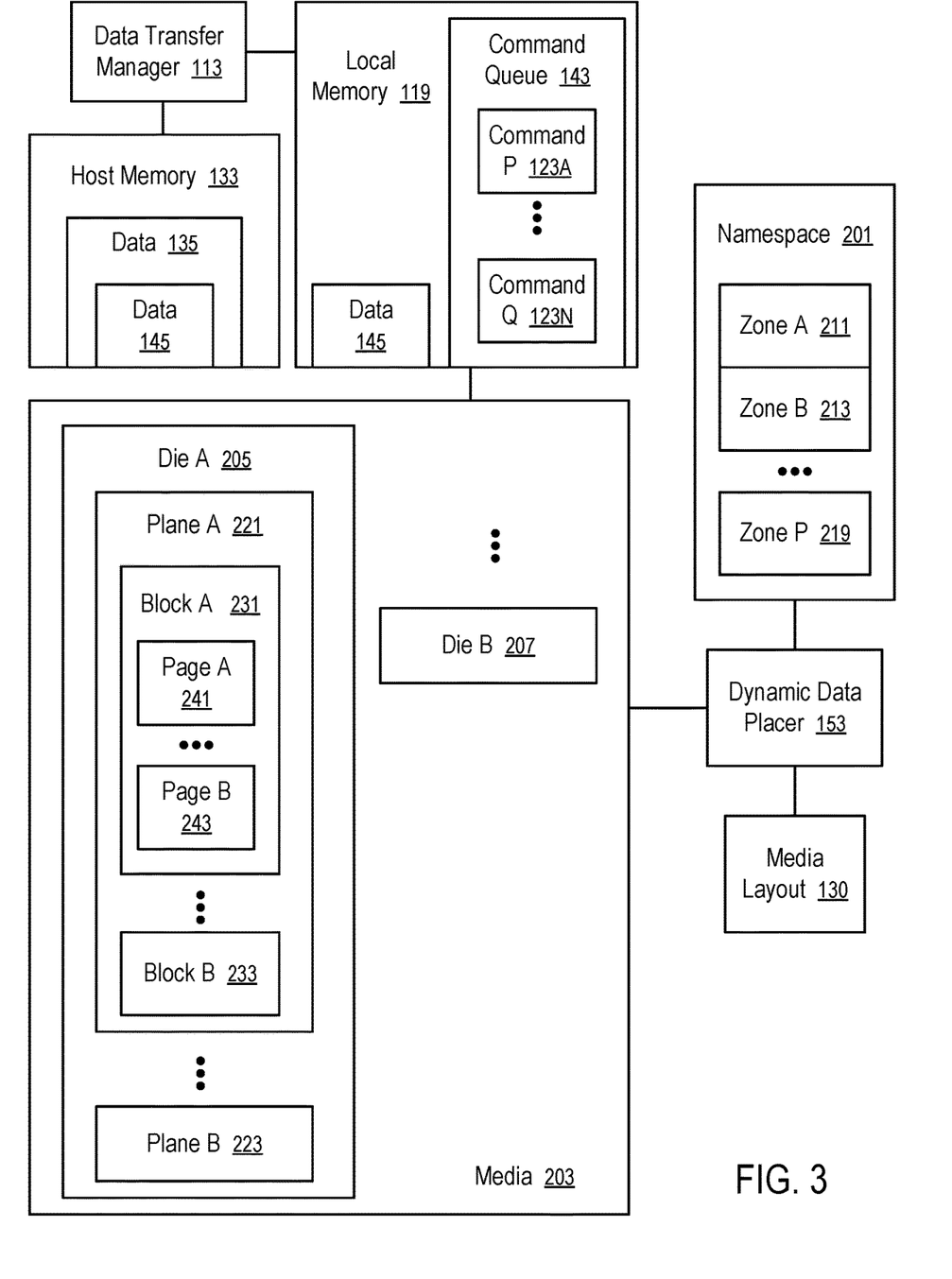
FIG. 3 shows an example of a memory sub-system having timed data transfer.

FIG. 3 shows an example of a memory sub-system having timed data transfer. For example, the memory sub-system of FIG. 3 can be implemented in the memory sub-system 110 of FIG. 1 using a data transfer manager 113 of FIG. 2. However, the techniques of FIG. 1 and FIG. 2 are not limited to the implementation of the memory sub-system illustrated in FIG. 3. For example, the techniques can be implemented a plain block device, a device that supports namespaces, or a device that supports zoned names spaces (e.g., a memory sub-system illustrated in FIG. 3). Thus, the disclosure presented herein is not limited to the example of FIG. 3.

In FIG. 3, a namespace 201 is configured on the media storage capacity of the memory sub-system 110. The namespace 201 provides a logical block addressing space that can be used by the host system 120 to specify memory locations for read or write operations. The namespace 201 can be allocated on a portion of the media storage capacity of the memory sub-system 110, or the entire media storage capacity of the memory sub-system 110. In some instances, multiple namespaces can be allocated on separate, non-overlapping portions of the media storage capacity of the memory sub-system 110.

In FIG. 3, the namespace 201 is configured with a plurality of zones 211, 213, . . . , 219. Each zone (e.g., 211) in the namespace allows random read access to local block addressing (LBA) addresses in the zone (e.g., 211) and sequential write access to LBA addresses in the zone (e.g., 211), but does not allow random write access to random LBA addresses in the zone (211). Thus, writing data into a zone (e.g., 211) is performed in a predetermined, sequential order in the LBA address space of the namespace 201.

When a zone (e.g., 211) in the namespace 201 is configured, it is possible to predetermine the media layout for the zone (e.g., 211) (e.g., for simplicity). The LBA addresses in the zone (e.g., 211) can be pre-mapped to the media 203 of the memory sub-system 110. However, such a predetermined media layout can cause media access collisions when there are multiple parallel write streams, as discussed above. Randomize the mapping from LBA addresses in the zone (e.g., 211) to memory locations in the media 203 can reduce collisions but cannot eliminate collisions.

Preferably, a dynamic data placer 153 is configured in the memory sub-system 110 to create portions of the media layout 130 at the time of the scheduling of write commands for execution such that media access collisions are complete eliminated. In some implementations, the dynamic data placer 153 can be part of the data transfer manager 113.

For example, the media 203 of the memory sub-system 110 can have multiple integrated circuit dies 205, . . . , 207. Each of the integrated circuit dies (e.g., 205) can have multiple planes 221, . . . , 223 of memory units (e.g., NAND memory cells). Each of the planes (e.g., 221) can have multiple blocks 231, . . . , 233 of memory units (e.g., NAND memory cells). Each of the blocks (e.g., 231) can have multiple pages 241, . . . , 243 of memory units (e.g., NAND memory cells). The memory units in each page (e.g., 241) is configured to be programmed to store/write/commit data together in an atomic operation; and the memory units in each block (e.g., 231) is configured to be erased data together in an atomic operation.

When a write command (e.g., 123A) for storing data in one zone (e.g., 211) and another write command (e.g., 123N) for storing data in another zone (e.g., 213) are scheduled for parallel execution as a result of two integrated circuit dies (e.g., 205 and 207) are available for concurrent operations for the write commands (e.g., 123A and 123N), the dynamic data placer 153 maps the LBA addresses of the write commands into pages located in the different dies (e.g., 205 and 207). Thus, media access collisions can be avoided.

Further, when the two integrated circuit dies (e.g., 205 and 207) are determined to be available for the execution of the write commands (e.g., 123A and 123N), the data transfer manager 113 initiates the transfer of the data 145 for the write commands (e.g., 123A and 123N) from the memory 133 of the host system 120 to the local memory 119 of the memory sub-system 110. Thus, most of the data 135 of the write commands in the queue 143 can be stored in the host memory 133, while the corresponding write commands themselves are accepted in the command queue 143 in the memory sub-system 110. The data 145 is for the write commands (e.g., 123A and 123N) that are ready to be executed for storing data into the memory cells in the integrated circuit dies (e.g., 205 and 207) that are available to service the write commands (e.g., 123A and 123N). Since only the data 145 is transferred just in time for the available integrated circuit dies (e.g., 205 and 207), the lifetime of the data 145 being buffered in the local memory 119 is reduced and/or minimized. Further, the amount of the data 145 buffered in the local memory 119 can be reduced and/or minimized. The reduction of the lifetime and amount of the data 145 of write commands can reduce the requirement for securing the content of the local memory 119 in a power failure event.

Figure 4:
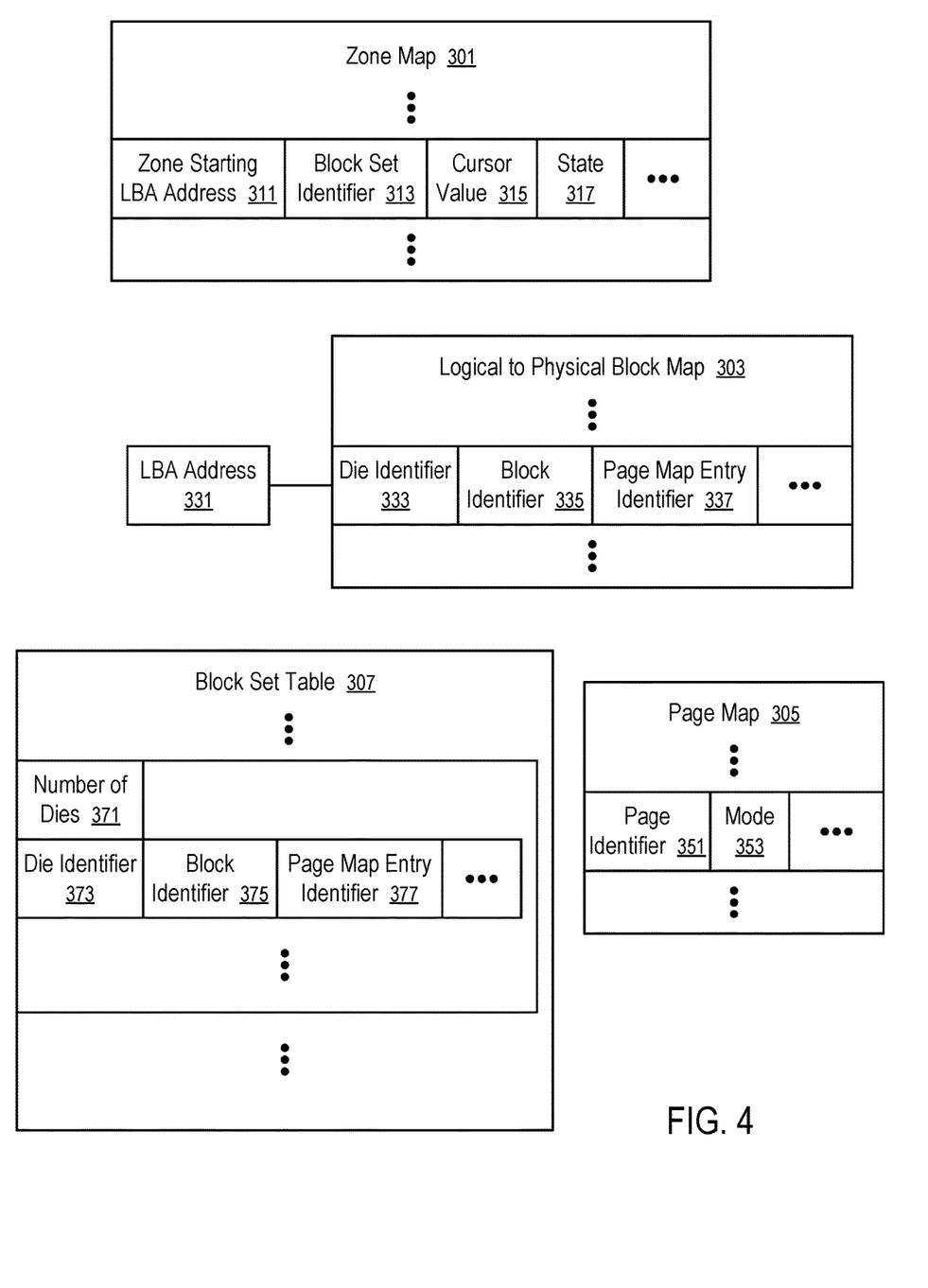
FIG. 4 illustrates an example of data structures configured to support data transfer between a host system and a memory sub-system.

FIG. 4 illustrates an example of data structures configured to support data transfer between a host system and a memory sub-system. For example, the media layout 130 of FIG. 3 can be implemented using the data structures of FIG. 4.

In FIG. 4, a zone map 301 is configured to provide media layout information for a zone (e.g., 211) in a namespace (e.g., 201). The zone map 301 can have multiple entries. Each entry in the zone map 301 identifies information about a zone (e.g., 211), such as a starting LBA address 311 of the zone (e.g., 211), a block set identifier 313 of the zone (e.g., 211), a cursor value 315 of the zone (e.g., 211), a state 317 of the zone (e.g., 211), etc.

The host system 120 writes data in the zone (e.g., 211) starting at the zone starting LBA address 311. The host system 120 writes data in the zone (e.g., 211) sequentially in the LBA space. After an amount of data has been written into the zone (e.g., 211), the current starting LBA address for writing subsequent data is identified by the cursor value 315. Each write command for the zone moves the cursor value 315 to a new starting LBA address for the next write command for the zone. The state 317 can have a value indicating that the zone (e.g., 211) is empty, full, implicitly open, explicitly open, closed, etc.

In FIG. 4, a logical to physical block map 303 is configured to facilitate the translation of LBA addresses (e.g., 331) into physical addresses in the media (e.g., 203).

The logical to physical block map 303 can have multiple entries. An LBA address (e.g., 331) can be used as, or converted into, an index for an entry in the logical to physical block map 303. The index can be used to look up an entry for the LBA address (e.g., 331). Each entry in the logical to physical block map 303 identifies, for an LBA address (e.g., 331), the physical address of a block of memory in the media (e.g., 203). For example, the physical address of the block of memory in the media (e.g., 203) can include a die identifier 333, a block identifier 335, a page map entry identifier 337, etc.

A die identifier 333 identifies a specific integrated circuit die (e.g., 205 or 207) in the media 203 of the memory sub-system 110.

A block identifier 335 identifies a specific block of memory (e.g., NAND flash memory) within the integrated circuit die (e.g., 205 or 207) that is identified using the die identifier 333.

A page map entry identifier 337 identifies an entry in a page map 305.

The page map 305 can have multiple entries. Each entry in the page map 305 can include a page identifier 351 that identifies a page of memory cells within a block of memory cells (e.g., NAND memory cells). For example, the page identifier 351 can include a word line number for the page and a sub block number for the page in the block of NAND memory cells. Further, the entry for the page can include a programming mode 353 of the page. For example, the page can be programmed in an SLC mode, an MLC mode, a TLC mode, or a QLC mode. When configured in the SLC mode, each memory cell in the page is to store one bit of data. When configured in the MLC mode, each memory cell in the page is to store two bits of data. When configured in the TLC mode, each memory cell in the page is to store three bits of data. When configured in the QLC mode, each memory cell in the page is to store four bits of data. Different pages in an integrated circuit die (e.g., 205 or 207) can have different modes for data programming.

In FIG. 4, the block set table 307 stores data controlling aspects of the dynamic media layout for a zone (e.g., 211).

The block set table 307 can have multiple entries. Each entry in the block set table 307 identifies a number/count 371 of integrated circuit dies (e.g., 205 and 207) in which data of the zone (e.g., 211) is stored. For each of the integrated circuit dies (e.g., 205 and 207) used for the zone (e.g., 211), the entry of the block set table 307 has a die identifier 373, a block identifier 375, a page map entry identifier 377, etc.

The die identifier 373 identifies a specific integrated circuit die (e.g., 205 or 207) in the media 203 of the memory sub-system 110, on which die (e.g., 205 or 207) subsequent data of the zone (e.g., 211) can be stored.

The block identifier 375 identifies a specific block (e.g., 231 or 233) of memory (e.g., NAND flash memory) within the integrated circuit die (e.g., 205 or 207) that is identified using the die identifier 373, in which block (e.g., 231 or 233) the subsequent data of the zone (e.g., 211) can be stored.

The page map entry identifier 337 identifies an entry in the page map 305, which identifies a page (e.g., 241 or 241) that can be used to store the subsequent data of the zone (e.g., 211).

Figure 5:
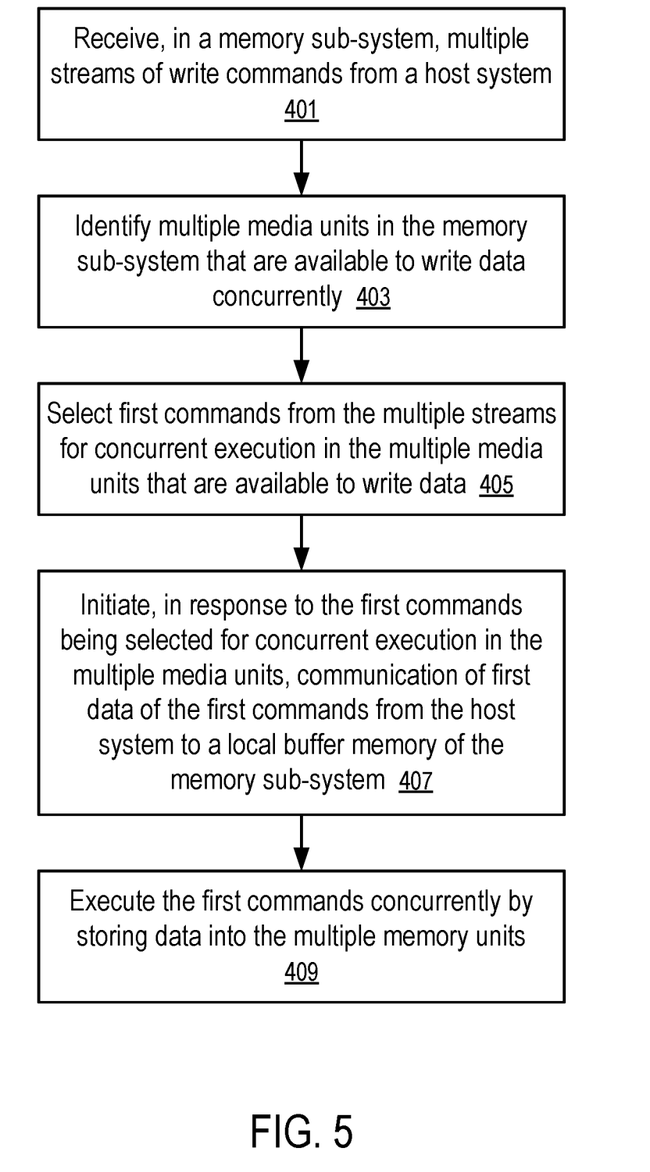
FIG. 5 shows a method of timed data transfer.

FIG. 5 shows a method of timed data transfer. The method of FIG. 5 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 5 is performed at least in part by the data transfer manager 113 of FIG. 1, 2, or 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 401, a memory sub-system 110 receives multiple streams of write commands from a host system 120. For example, each respective stream in the multiple streams is configured to write data sequentially in a logical address space in one embodiment; and in another embodiment, a stream in the multiple streams is configured to write data pseudo-sequentially, or randomly in a logical address space in one embodiment. Each write stream includes a set of commands that are tagged to write, trim, overwrite a set of data together as a group. In the group, the data can be written in a logical space sequentially, randomly, or pseudo-sequentially. Preferably, the data in the group is written into an erase block set, where memory cells in the erase block set store data for the stream but not data from other streams. The erase block set can be erased to remove the data of the stream without erasing the data of other streams.

For example, each of write streams is permitted to sequentially write at LBA addresses in a zone (e.g., 211) in a namespace (e.g., 201) allocated on a media 203 of the memory sub-system 110, but prohibited from writing data out of sequence in the LBA address space.

At block 403, a data transfer manager 113 of the memory sub-system 110 identifies multiple media units (e.g., 109A to 109N) in the memory sub-system 110 that are available to write data concurrently.

At block 405, the data transfer manager 113 selects first commands from the multiple streams for concurrent execution in the multiple media units that are available to write data.

At block 407, the data transfer manager 113 initiates, in response to the first commands being selected for concurrent execution in the multiple media units, communication of first data of the first commands from the host system 120 to a local buffer memory 119 of the memory sub-system 110. For example, the transferring of the first data is postponed until the multiple media units are available to perform write operations for storing the first data. The postponed transfer reduces the time of the first data being buffered. In response to the multiple media units being available to perform write operations, a buffer space in the local buffer memory 119 is allocated for the first data for the buffering of the first data communicated from the host system 120 to the memory sub-system 110.

At block 409, the memory sub-system 110 executes the first commands concurrently by storing data into the multiple memory units. For example, as soon as the first data has been transferred from the local buffer memory 119 to the multiple media units, the buffer space allocated for the first data can be released from buffering the first data. In some instances, the buffer space can be released before the multiple media units completes programming/writing the first data.

For example, at the time of scheduling the first commands for execution, execution second commands can be in progress in a subset of memory units of the media 203 of the memory sub-system 110. Thus, the subset of memory units used for the execution of the second commands are not available for the first commands. After the first commands are scheduled for a subset of memory units of the media 203 of the memory sub-system 110, the data transfer manager 113 initiates the transfer of the data to be written via the first commands from the host system 120 to the memory sub-system 110. The just-in-time transfer of the data of the first commands reduces the amount and time of data being buffered in the local memory 119 of the memory sub-system 110 and thus reduces the capacity requirement of the local memory 119 and the capacity requirement of the power-fail hold-up circuit 141 configured for the local memory 119. The first commands can be executed in the multiple media units concurrently and/or concurrently with the progress of the execution of the second commands in remaining media units of the memory sub-system 110.

For example, the memory sub-system 110 is configured to buffer, in the local buffer memory 119, no more than a predetermined number of units of data. The predetermined number corresponds to the number of media units 109A to 109N in the memory sub-system 110 that are capable of operating independent from each other in writing data. Each unit of data is no more than a maximum amount of data to be written in a media unit (e.g., 109A or 109N) in response to a single write command. Thus, the buffer capacity of the local memory 119 does not limit the number of write streams the host system 120 can send to the memory sub-system 110.

The reduced amount and time of data being buffered in the local memory 133 can reduce the requirement for the corresponding power-fail hold-up circuit 141 of the memory sub-system 110.

The memory sub-system 110 can accept and queue write commands in one or more queues 143 in the local memory 119. The number of queued write commands can be significantly more than the predetermined number of units of data that can be buffered in the local memory 119. Since the performance of the memory sub-system 110 is limited by the bandwidth of the media units 109A to 109N to commit, write, store, or program data concurrently in execution of concurrent write commands, the limited buffer capacity of the local memory 119 for the data of write commands does not impact the performance of the memory sub-system 110.

When more commands are queued than what can be executed concurrently, the memory sub-system 110 can selectively execution certain commands out of their order in arriving in the memory sub-system 110.

The reduced buffer memory requirement allows the local memory 119 to be configured as static random access memory (SRAM) of the controller 115 and thus eliminate the need for DRAM in buffering data to be written in the media 203 of the memory sub-system 110. For example, a capacity of the static random access memory (SRAM) to buffer data of write commands can be less than the capacity required to buffer all of write commands queued in the memory sub-system.

Optionally, each respective media unit (e.g., 109A or 109N) has a command queue for write commands that are configured to write data into the respective media unit (e.g., 109A or 109N). The command queue can store multiple write commands; and the local memory 119 can be configured to limit its buffer memory for the data of the write commands. For example, the buffer memory can be limited to the capacity of a small portion of the commands in the queue. For example, the buffer memory can be limited to the size of the data that can be programmed/written/stored/committed into the respective media unit (e.g., 109A or 109N) in response to a single write command (or a predetermined number write commands that is smaller than a total number of write commands that can be queued for the respective media unit).

Optionally, the portion of the media layout 130 for the logical addresses used in the first commands is determined dynamically in response to the determination that the first commands can be executed concurrently in the available media units.

For example, after the identification of the multiple memory units (e.g., integrated circuit dies) that are available for the execution of next commands, the data transfer manager 113 can identify, from the block set table 307, the physical addresses that can be used to store data of the next commands. The physical addresses can be used to update the corresponding entries in the logical to physical block map 303 for the LBA addresses used in the next commands.

For example, when an integrated circuit die (e.g., 205) is free to write data, the data transfer manager 113 can determine a command of a zone that can be written/programmed into the memory cells in the integrated circuit die (e.g., 205). From the block set table 307, the data transfer manager 113 and/or the dynamic data placer 153 can locate an entry for the zone (e.g., 205), locate the block identifier 375 and the page map entry identifier 377 associated with the identifier 373 of the integrated circuit die (e.g., 205), and use the die identifier 373, the block identifier 375, and the page map entry identifier 377 to update the corresponding fields of the entry in the logical to physical block map 303 for the LBA address 331 used in the command of the zone (e.g., 211). Thus, the command of the zone (e.g., 211) can be executed without media access collision for the LBA address 331.

In some implementations, a communication channel between the processing device 118 and a memory sub-system 110 includes a computer network, such as a local area network, a wireless local area network, a wireless personal area network, a cellular communications network, a broadband high-speed always-connected wireless communication connection (e.g., a current or future generation of mobile network link); and the processing device 118 and the memory sub-system can be configured to communicate with each other using data storage management and usage commands similar to those in NVMe protocol.

A memory sub-system 110 in general can have non-volatile storage media. Examples of non-volatile storage media include memory cells formed in an integrated circuit and magnetic material coated on rigid disks. Non-volatile storage media can maintain the data/information stored therein without consuming power. Memory cells can be implemented using various memory/storage technologies, such as NAND logic gate, NOR logic gate, phase-change memory (PCM), magnetic memory (MRAM), resistive random-access memory, cross point storage and memory devices (e.g., 3D XPoint memory). A cross point memory device uses transistor-less memory elements, each of which has a memory cell and a selector that are stacked together as a column. Memory element columns are connected via two perpendicular layers of wires, where one layer is above the memory element columns and the other layer below the memory element columns. Each memory element can be individually selected at a cross point of one wire on each of the two layers. Cross point memory devices are fast and non-volatile and can be used as a unified memory pool for processing and storage.

The controller (e.g., 115) of a memory sub-system (e.g., 110) can run firmware to perform operations responsive to the communications from the processing device 118. Firmware in general is a type of computer program that provides control, monitoring and data manipulation of engineered computing devices.

Some embodiments involving the operation of the controller 115 can be implemented using computer instructions executed by the controller 115, such as the firmware of the controller 115. In some instances, hardware circuits can be used to implement at least some of the functions. The firmware can be initially stored in the non-volatile storage media, or another non-volatile device, and loaded into the volatile DRAM and/or the in-processor cache memory for execution by the controller 115.

A non-transitory computer storage medium can be used to store instructions of the firmware of a memory sub-system (e.g., 110). When the instructions are executed by the controller 115 and/or the processing device 117, the instructions cause the controller 115 and/or the processing device 117 to perform a method discussed above.

Figure 6:
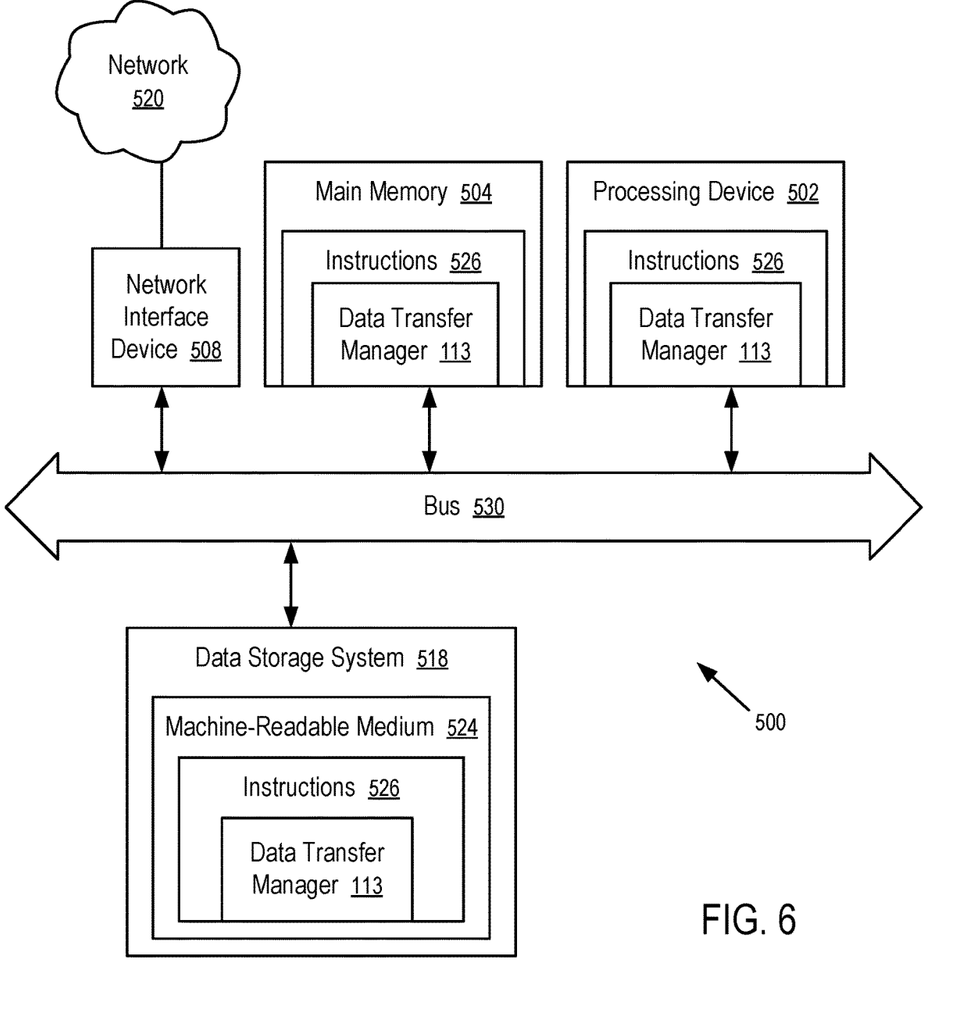
FIG. 6 is a block diagram of an example computer system in which embodiments of the present disclosure can operate.

FIG. 6 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a data transfer manager 113 (e.g., to execute instructions to perform operations corresponding to the data transfer manager 113 described with reference to FIGS. 1-5). In alternative embodiments, the machine can be connected (e.g., networked) to other machines in a LAN, an intranet, an extranet, and/or the internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 518, which communicate with each other via a bus 530 (which can include multiple buses).

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a data transfer manager 113 (e.g., the data transfer manager 113 described with reference to FIGS. 1-5). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using application-specific integrated circuit (ASIC) or field-programmable gate array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
   media units operable independent from each other;
   a memory;
   a circuit configured to control buffering of data, from a plurality of streams of write commands, into the memory based on a determination of a subset of the media units available to execute write commands concurrently;
   determine, based on a count of the subset of the media units, a number of units of data;
   buffer no more than the number of units of data from the plurality of streams into the memory; and
   select first commands from the plurality of streams for concurrent execution in the subset of the media units.

2. The device of claim 1, wherein each unit of data, among the number of units of data is no more than a maximum amount of data writable via execution of a single write command by a media unit, among the subset of the media units.

3. The device of claim 1, further comprising:
   an interface operable to receive the plurality of streams from a host system.

4. The device of claim 1, wherein the circuit is further configured to
   request communication of first data of the first commands, from a host system, to the memory.

5. The device of claim 4, wherein the circuit is further configured to execute, using the subset of the media units concurrently, the first commands to store the first data of the first commands into the subset of the media units.

6. The device of claim 5, wherein the circuit is further configured to allocate a buffer space in the memory for the first data of the first commands in response to the subset of the media units being available to operate concurrently and to release the buffer space in response to completion of providing the first data of the first commands from the memory to the subset of the media units.

7. The device of claim 6, wherein the circuit is further configured to place, in at least one command queue, write commands, including the first commands, that are more than the count of the subset of media units.

8. The device of claim 7, wherein the circuit is further configured to select the first commands, out of order, from the command queue.

9. The device of claim 8, wherein the plurality of streams identifies logical addresses of data to be written into the device in a logical address space identified via a namespace; the namespace has a plurality of zones; and the plurality of streams are configured to write in the plurality of zones respectively.

10. The device of claim 9, wherein each respective stream among the plurality of streams is configured to write data sequentially in the logical address space in a respective zone among the plurality of zones.

11. A method, comprising:
    determining, by a device having a memory and media units operable independent from each other, a subset of the media units available to execute write commands concurrently;
    controlling buffering of data, from a plurality of streams of write commands, into the memory based on identification of the subset of the media units;
    determining, based on a count of the subset of the media units, a number of units of data; and
    buffering no more than the number of units of data from the plurality of streams into the memory;
    wherein each unit of data, among the number of units of data is no more than a maximum amount of data writable via execution of a single write command.

12. The method of claim 11, wherein each unit of data, among the number of units of data is no more than a maximum amount of data writable via execution of a single write command by a media unit, among the subset of the media units.

13. The method of claim 11, further comprising:
    selecting first commands from the plurality of streams for concurrent execution in the subset of the media units; and
    requesting communication of first data of the first commands, from a host system, to the memory.

14. The method of claim 13, further comprising:
    executing, using the subset of the media units concurrently, the first commands to store the first data of the first commands into the subset of the media units.

15. The method of claim 14, further comprising:
    placing, in at least one command queue in the device, write commands, including the first commands, that are more than the count of the subset of media units;
    selecting the first commands, out of order, from the command queue;
    allocating a buffer space in the memory for the first data of the first commands in response to the subset of the media units being available to operate concurrently; and
    releasing the buffer space in response to completion of providing the first data of the first commands from the memory to the subset of the media units.

16. The method of claim 15, wherein the plurality of streams identifies logical addresses of data to be written into the device in a logical address space identified via a namespace; the namespace has a plurality of zones; the plurality of streams are configured to write in the plurality of zones respectively; and each respective stream among the plurality of streams is configured to write data sequentially in the logical address space in a respective zone among the plurality of zones.

17. A non-transitory computer storage medium storing instructions which when executed by a device having a memory and media units operable independent from each other, cause the device to perform a method, the comprising:

identifying, by the device, a subset of the media units available to execute write commands concurrently;

determining, based on identification of the subset of the media units, an amount of data;

buffering no more than the amount of data from a plurality of streams of write commands into the memory;

executing, using the subset of the media units concurrently, first commands to store the amount of into the subset of the media units;

placing, in at least one command queue in the device, write commands, including the first commands, that are more than the count of the subset of media units; and allocating a buffer space in the memory for first data of the first commands in response to the subset of the media units being available to operate concurrently.

18. The non-transitory computer storage medium of claim 17, wherein the method further comprises:

selecting the first commands, out of order, from the command queue for concurrent execution in the subset of the media units;

requesting communication of the first data of the first commands, from a host system, to the buffer space; and releasing the buffer space in response to completion of providing the first data of the first commands from the memory to the subset of the media units.

* * * * *